(12) United States Patent
Wu et al.

(10) Patent No.: US 11,576,256 B2
(45) Date of Patent: Feb. 7, 2023

(54) PRINTED CIRCUIT BOARD FOR GALLIUM NITRIDE ELEMENTS

(71) Applicant: Delta Electronics (Shanghai) Co., Ltd., Shanghai (CN)

(72) Inventors: Tao Wu, Shanghai (CN); Jian Qi, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/455,018

(22) Filed: Nov. 16, 2021

(65) Prior Publication Data
US 2022/0201851 A1   Jun. 23, 2022

(30) Foreign Application Priority Data
Dec. 17, 2020 (CN) .......................... 202011492013.7

(51) Int. Cl.
*H05K 1/02* (2006.01)
*H05K 1/11* (2006.01)

(52) U.S. Cl.
CPC .......... *H05K 1/0295* (2013.01); *H05K 1/111* (2013.01); *H05K 1/112* (2013.01)

(58) Field of Classification Search
CPC .......... H05K 1/02; H05K 1/112; H05K 1/111; H05K 1/0295
USPC ........................................................ 361/767
See application file for complete search history.

(56) References Cited

FOREIGN PATENT DOCUMENTS

CN   201018713 Y   2/2008
CN   106714450 A   5/2017

*Primary Examiner* — Tremesha S Willis
(74) *Attorney, Agent, or Firm* — CKC & Partners Co., LLC (57) ABSTRACT

The invention provides a PCB for gallium nitride device, on which has been formed: a gallium nitride welding position to which first and second gallium nitride elements having different packages are interchangeably welded; a first/second driving circuit welding position to which a first/second driving circuit of the first/second gallium nitride element is welded; wherein the gallium nitride welding position includes: a first and second gate pad respectively welded to gate electrode of the first and second gallium nitride element and respectively connected to gate signal terminal of the first and second driving circuit; a first and a second ground pad; a first contact contactless connected to the first ground pad and directly connected to ground terminal of the first driving circuit; and a second contact contactless connected to the second ground pad and directly connected to ground terminal of the second driving circuit.

12 Claims, 7 Drawing Sheets

PRINTED CIRCUIT BOARD FOR GALLIUM NITRIDE ELEMENTS

CROSS-REFERENCE TO RELATED APPLICATIONS

This non-provisional application claims priority under 35 U.S.C. § 119(a) on Patent Applications No. 202011492013.7 filed in P.R. China on Dec. 17, 2020, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The invention relates to design of welding patterns on a printed circuit board, and specifically to design of welding patterns on a printed circuit board for a gallium nitride device.

BACKGROUND

Gallium nitride is referred to as the third generation of semiconductor core materials. As compared to silicon, gallium nitride has a wider band gap, which means that gallium nitride can bear a higher voltage than silicon, and has better conductive ability. In short, if the two materials have the same volume, gallium nitride has a higher efficiency than silicon. Therefore, more and more power devices adopt gallium nitride elements.

However, in design and manufacture of most products using gallium nitride elements, the same position often shall adapt products from different suppliers of elements to avoid that the some suppliers of gallium nitride elements have issues of quality or out of stock later, thereby increasing flexibility of production materials. However, different gallium nitride factories use different packages when manufacturing the gallium nitride elements, so a single position on the circuit board cannot adapt to the gallium nitride elements having different packages.

Regarding this, currently, the common method is to reserve welding positions for the gallium nitride elements having different packages on the printed circuit board, or provide conversion boards corresponding to the gallium nitride elements having different packages to weld the gallium nitride elements to a same welding position on the printed circuit board via the conversion boards. However, since the current products are miniaturized gradually, an area on the circuit board is quite limited, so it is difficult to reserve two or more welding positions on the printed circuit board, and if the method of different small conversion boards is used, it causes difficulty and waste of the materials, and increase of cost.

Therefore, it is necessary to develop a printed circuit board for a gallium nitride element, which can be compatible with gallium nitride elements having different package manufactured by two different factories, save a wiring space, and miniaturize products while not increasing cost of materials.

SUMMARY

An object of the invention is to provide a novel design of wiring of a circuit on a printed circuit board, which can be compatible with gallium nitride elements having different package manufactured by two different factories, save a wiring space, and miniaturize products while not increasing cost of materials.

To realize the object, the invention provides a printed circuit board for a gallium nitride device, on which has been formed with: a gallium nitride welding position to which a first gallium nitride element and a second gallium nitride element having different encapsulations are interchangeably welded; a first driving circuit welding position to which a first driving circuit of the first gallium nitride element is welded; and a second driving circuit welding position to which a second driving circuit of the second gallium nitride element is welded.

BRIEF DESCRIPTION OF THE DRAWINGS

To understand the manner of the above recited features of the disclosure in details, a more particular description of the disclosure, briefly summarized above, may be obtained with reference to embodiments. The accompanying drawings relate to embodiments of the disclosure, and are described as follows.

DETAILED DESCRIPTION

Now various embodiments of the invention are explicitly described, and one or more examples of the embodiments are illustrated in the drawings. In the following description of the drawings, the same reference sign indicates the same parts or factors. Only differences of the individual embodiment are described. Each example is provided to explain the technical solutions, rather than limiting the scope of the invention. In addition, the feature illustrated or described as a part of one embodiment may be applied to other embodiments, or combined with other embodiments to produce a further embodiment. Such modifications and variations included in the intent are described.

Figure 1:
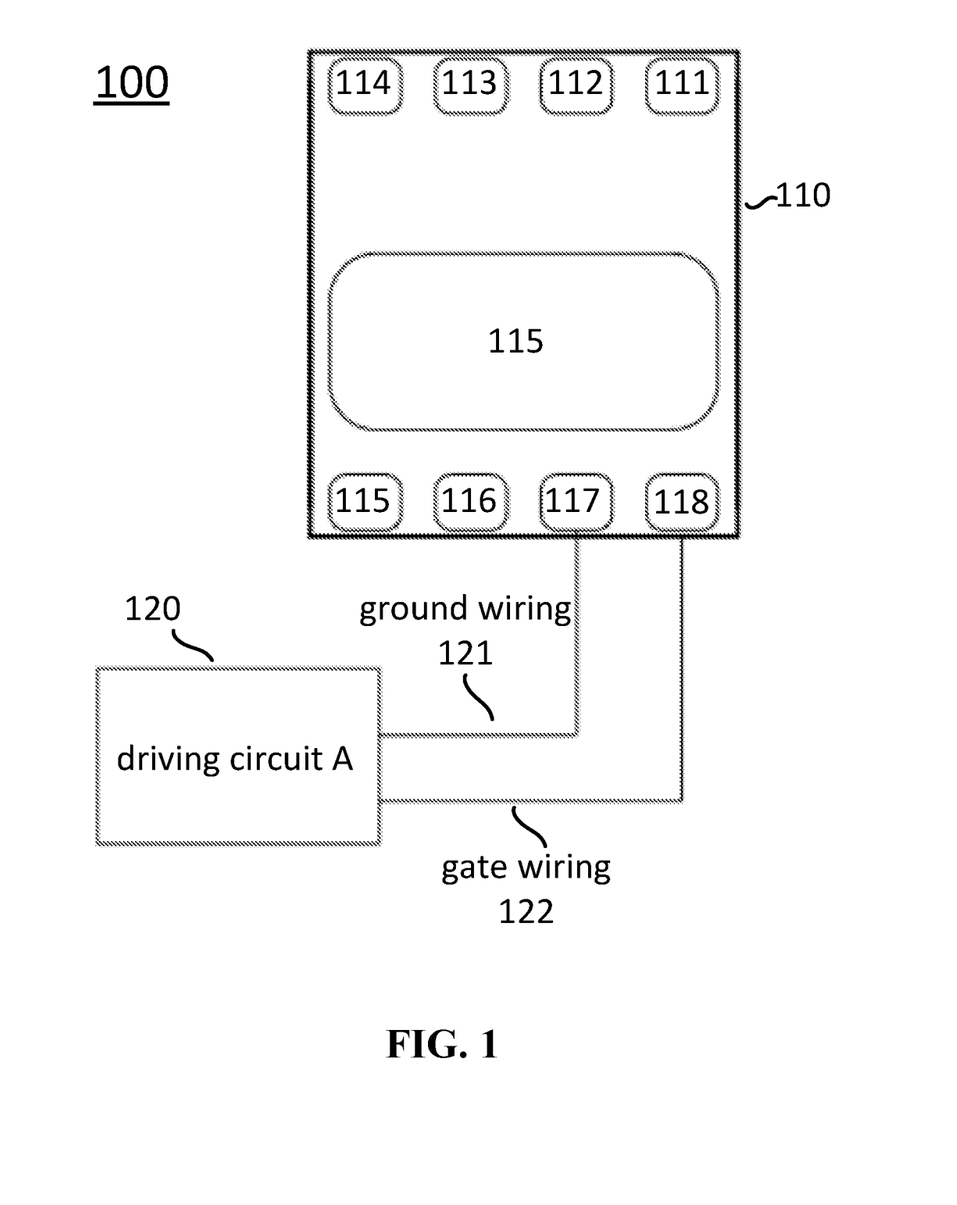
FIG. 1 is a schematic diagram of a common printed circuit board (PCB) for a first gallium nitride element.

FIG. 1 illustrates a design of wiring of a printed circuit board (PCB) 100 for a first gallium nitride element having a first package form.

A welding position 110 for the first gallium nitride element and a driving circuit welding position 120 for a driving circuit A are formed on the PCB 100 shown in FIG. 1, and the driving circuit A is configured to drive the first gallium nitride element. The welding position 110 includes eight pads 111-118 and a silkscreen having a rectangular frame to surround these eight pads, and the silkscreen having the rectangular frame is configured to identify a position of the first gallium nitride element.

These pads 111-118 correspond to different pins of the first gallium nitride element. For example, as for the first gallium nitride element having the first package form, a drain pin of the first gallium nitride element is welded to the pads 111-114, a source pin of the first gallium nitride element is welded to the pads 115-116, a ground pin of the first gallium nitride element is welded to the pad 117, and connected to a ground terminal of the driving circuit A via a ground wiring 121, and a gate pin of the first gallium nitride element is welded to the pad 118, and connected to a gate signal terminal of the driving circuit A via a gate wiring 122.

Figure 2:
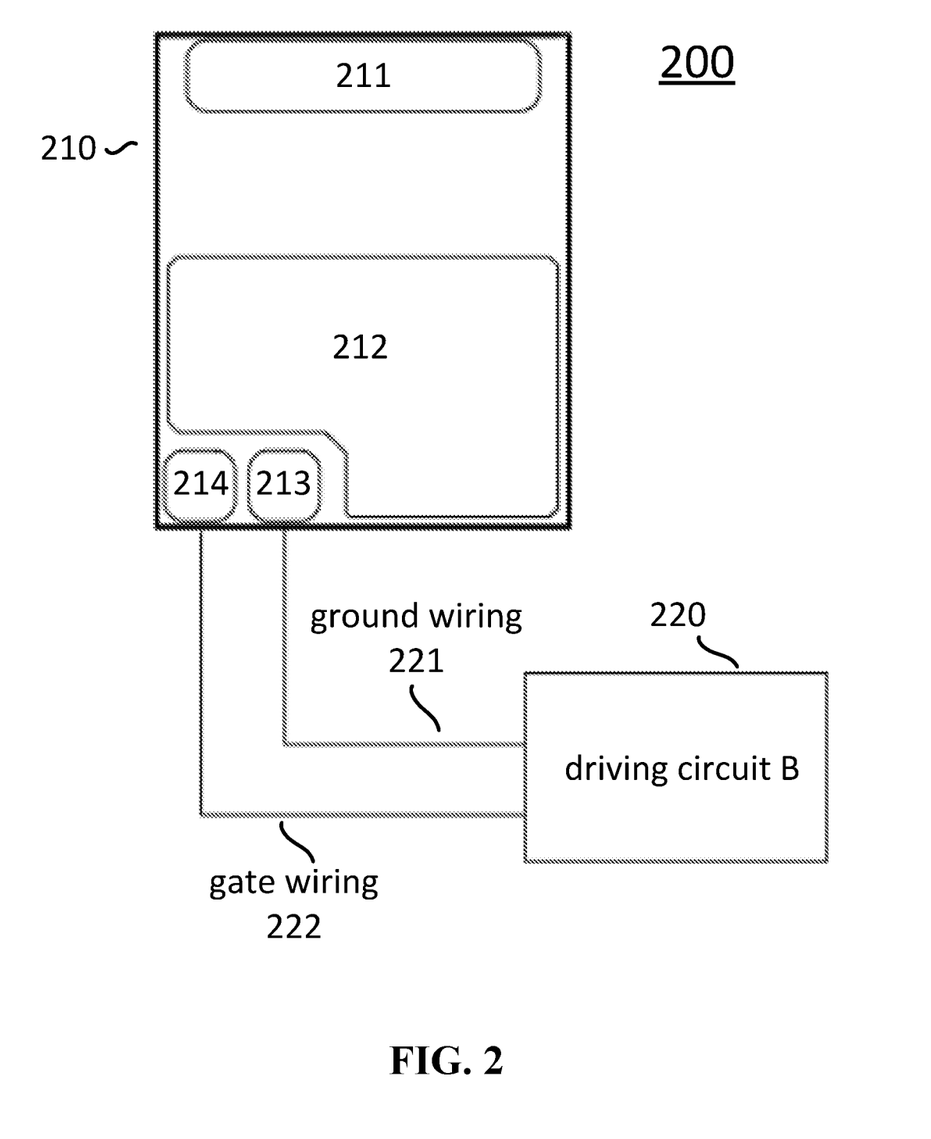
FIG. 2 is a schematic diagram of a common PCB for a second gallium nitride element.

FIG. 2 illustrates a design of wiring of a PCB 200 for a second gallium nitride element having a second package form, wherein the second package form is different from the first encapsulation form of the first gallium nitride element discussed above with reference to FIG. 1.

A welding position 210 for the second gallium nitride element and a driving circuit welding position 220 for a driving circuit B are formed on the PCB 200 shown in FIG. 2, and the driving circuit B is configured to drive the second gallium nitride element. The welding position 210 includes four pads 211-214 and a silkscreen having a rectangular frame to surround these four pads, and the silkscreen having the rectangular frame is configured to identify a position of the second gallium nitride element.

These pads 211-214 correspond to different pins of the second gallium nitride element. For example, as for the second gallium nitride element having the second package form, a drain pin of the second gallium nitride element is welded to the pad 211, a source pin of the second gallium nitride element is welded to the pad 212, a ground pin of the second gallium nitride element is welded to the pad 213, and connected to a ground terminal of the driving circuit B via a ground wiring 221, and a gate pin of the second gallium nitride element is welded to the pad 214, and connected to a gate signal terminal of the driving circuit B via a gate wiring 222.

As can be seen from FIGS. 1 and 2, as for the first gallium nitride element having the first package and the second gallium nitride element having the second package, although positions for welding the drain and source pins of the first and second gallium nitride elements on the PCB are substantially the same, due to the different positions of the ground and gate pins between the first gallium nitride element and the second gallium nitride element, the second gallium nitride element cannot be welded to the PCB 100 in FIG. 1, or the first gallium nitride element cannot be welded to the PCB 200 in FIG. 2. Therefore, the gallium nitride elements having different packages from different factories cannot share the PCB having the same design of wiring.

Figure 3:
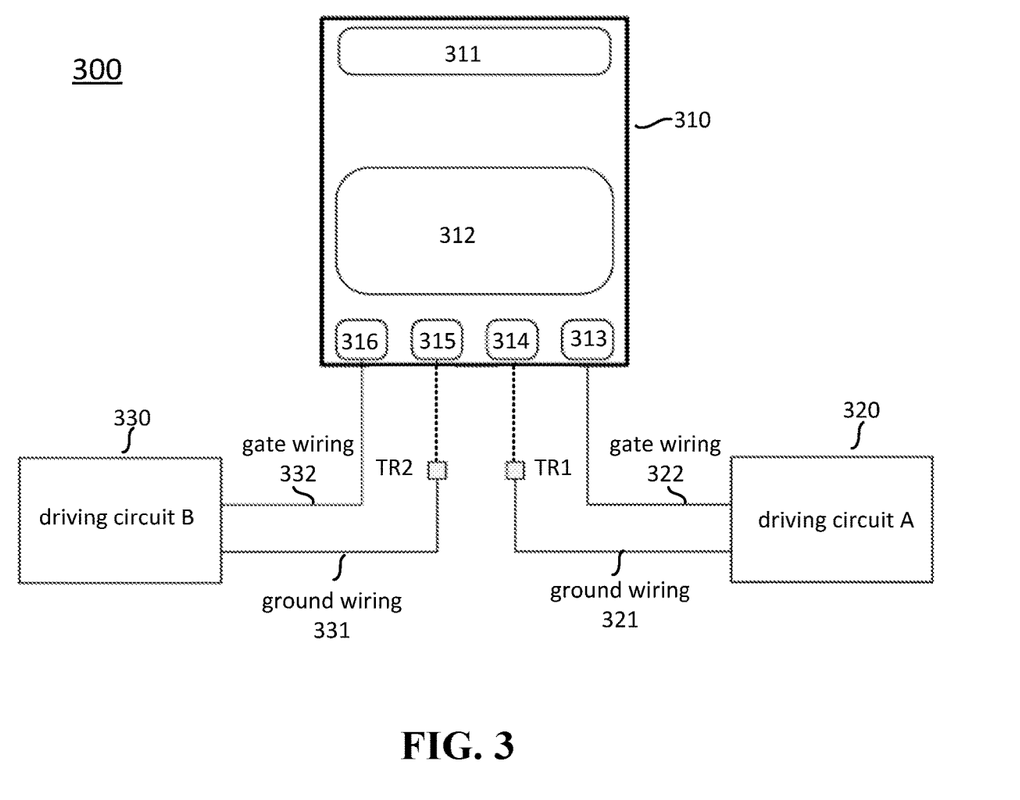
FIG. 3 is a schematic diagram of a PCB for a gallium nitride element according to one embodiment of the invention.

FIG. 3 illustrates a schematic diagram of a PCB 300 for a gallium nitride element according to one embodiment of the invention.

A welding position 310 for the gallium nitride element, a driving circuit welding position 320 for the driving circuit A, and a driving circuit welding position 330 for the driving circuit B are formed on the PCB 300 shown in FIG. 3. As for the welding position 310, for example, the welding position 310 can be compatible with the first gallium nitride element having the first package form and the second gallium nitride element having the second package form as discussed above. That is, the first gallium nitride element and the second gallium nitride element are interchangeably welded to the welding position 310, the driving circuit A can be configured to drive the first gallium nitride element, and the driving circuit B can be configured to drive the second gallium nitride element.

The welding position 310 includes six pads 311-316 and a silkscreen having a rectangular frame to surround the six pads, and the silkscreen having the rectangular frame is configured to identify a position of the gallium nitride element.

The pad 311 corresponds to a position of the drain pin of the first or second gallium nitride element, so when the first or second gallium nitride element is welded to the PCB 300, the drain pin of the first or second gallium nitride element is welded to the pad 311. The pad 312 corresponds to a position of the source pin of the first or second gallium nitride element, so when the first or second gallium nitride element is welded to the PCB 300, the source pin of the first or second gallium nitride element is welded to the pad 312. Since the positions of the drain pins and the source pins of the first and second gallium nitride elements are substantially the same, the pads 311 and 312 in the welding position 310 may be shared by the first and second gallium nitride elements.

A first contact TR1 and a second contact TR2 are further formed on the PCB 300. The gate signal terminal of the driving circuit A is connected to the pad 313 via a gate wiring 322, and the ground terminal of the driving circuit A is connected to the first contact TR1 via a ground wiring 321. The gate signal terminal of the driving circuit B is connected to the pad 316 via a gate wiring 332, and the ground terminal of the driving circuit B is connected to the second contact TR2 via a ground wiring 331. The first contact TR1 is associated with the pad 314, and contactless connected to the pad 314, the second contact TR2 is associated with the pad 315, and contactless connected to the pad 315, as shown by a dashed line in FIG. 3. In some embodiments, the first contact TR1 and the pad 314 can be connected by a resistor (e.g., 0-100Ω chip resistor or 0-100Ω plug-in resistor), a jumper wire or a switch. Similarly, the second contact TR2 and the pad 315 also can be connected by a resistor, a jumper wire or a switch. Therefore, when the first contact TR1 shall be connected to the pad 314, connection between the pad 314 and the ground terminal of the driving circuit A can be realized through the resistor, the jumper wire or the switch, and when the second contact TR2 shall be connected to the pad 315, connection between the pad 315 and the ground terminal of the driving circuit B can be realized through the resistor, the jumper wire or the switch.

The pads 313 and 314 correspond to the gate pin and the ground pin of the first gallium nitride element, respectively, so when the first gallium nitride element shall be welded to the PCB 300, the gate pin and the ground pin of the first gallium nitride element are welded to the pads 313 and 314, respectively. The pads 315 and 316 correspond to the gate pin and the ground pin of the second gallium nitride element, respectively, so when the second gallium nitride element shall be welded to the PCB 300, the gate pin and the ground pin of the second gallium nitride element are welded to the pads 315 and 316, respectively.

Hereinafter compatibility between the PCB 300 and the first and second gallium nitride elements is explained.

When the first gallium nitride element shall be welded to the PCB 300, the first gallium nitride element is welded to the welding position 310, the driving circuit A for driving the first gallium nitride element is welded to the welding position 320, and the welding position 330 is not welded with any component. At this time, the drain and source pins of the first gallium nitride element are welded to the pads 311 and 312, respectively; the gate pin of the first gallium nitride element is welded to the pad 313, so as to be connected to the gate signal terminal of the driving circuit A via the gate wiring 322; and the ground pin of the first gallium nitride element is welded to the pad 314, and the pad 314 is connected to the first contact TR1 through the resistor, the jumper wire or the switch, so as to be connected to the ground terminal of the driving circuit A via the ground wiring 321. Accordingly, although the first gallium nitride element having the first package form also have the source pin at the position corresponding to the pads 315 and 316, and the source pin of the first gallium nitride element is also welded to the pads 315 and 316, since the welding position 330 is not welded with any component, and the pad 315 and the second contact TR2 are contactless, even if the source pin of the first gallium nitride element is welded to the pads 315 and 316, there is no influence on the first gallium nitride element, so after the first gallium nitride element and the driving circuit A are welded to the PCB 300, the circuit can work normally.

Similarly, when the second gallium nitride element shall be welded to the PCB 300, the second gallium nitride element is welded to the welding position 310, the driving circuit B for driving the second gallium nitride element is welded to the welding position 330, and the welding position 320 is not welded with any component. At this time, the drain and source pins of the second gallium nitride element are welded to the pads 311 and 312, respectively; the gate pin of the second gallium nitride element is welded to the pad 316, so as to be connected to the gate signal terminal of the driving circuit B via the gate wiring 332; and the ground pin of the first gallium nitride element is welded to the pad 315, and the pad 315 is connected to the second contact TR2 through the resistor, the jumper wire or the switch, so as to be connected to the ground terminal of the driving circuit B via the ground wiring 331. Accordingly, although the second gallium nitride element having the second package form also have the source pin at the position corresponding to the pads 313 and 314, and the source pin of the second gallium nitride element is also welded to the pads 313 and 314, since the welding position 320 is not welded with any component, and the pad 314 and the first contact TR1 are contactless, even if the source pin of the second gallium nitride element is welded to the pads 313 and 314, there is no influence on the second gallium nitride element, so after the second gallium nitride element and the driving circuit B are welded to the PCB 300, the circuit can work normally.

Therefore, the PCB 300 having the welding positions 310-330 and the first and second contacts TR1 and TR2 can be compatible with the two gallium nitride elements having different package forms, only if the positions of the drain and source pins of the gallium nitride elements having different package forms are substantially the same. In such way, the PCB 300 can be compatible with the gallium nitride elements having different package forms by one welding position, and it is unnecessary to reserve different welding positions for different gallium nitride elements, or adapt the gallium nitride elements and the PCB through conversion boards. The PCB 300 is designed to save a wiring space, and miniaturize products while not increasing cost of materials.

According to the embodiment that can be combined with any other embodiments described in the invention, the first and second contacts TR1 and TR2 in the PCB 300 can be pads or via holes.

Figure 4:
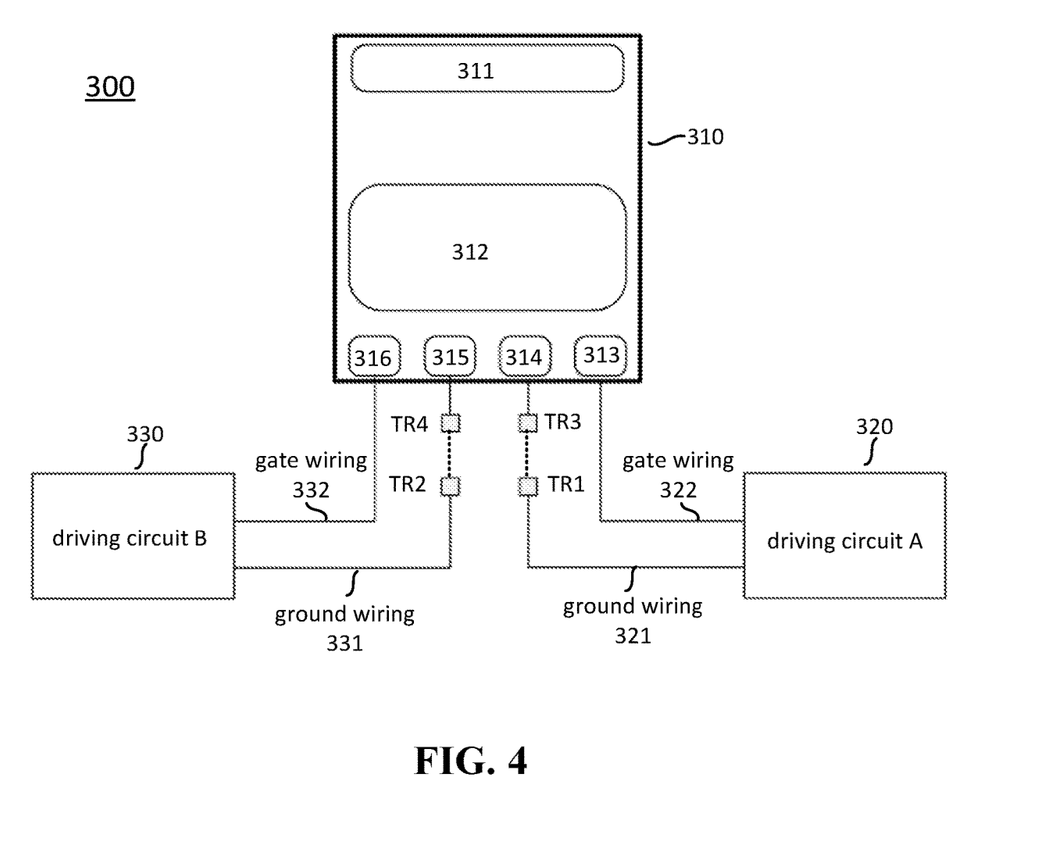
FIG. 4 is a schematic diagram of a PCB for a gallium nitride element according to another embodiment of the invention.

FIG. 4 is a schematic diagram of a PCB for a gallium nitride element according to another embodiment of the invention. The PCB shown in FIG. 4 is similar with that in FIG. 3, and difference in that a third contact TR3 and a fourth contact TR4 are further formed on the PCB 300 of FIG. 4. The third contact TR3 is connected to the pad 314, and the fourth contact TR4 is connected to the pad 315. The third contact TR3 is associated with the first contact TR1, i.e., the third contact TR3 is contactless connected to the first contact TR1 (e.g., through a resistor, a jumper wire or a switch). The fourth contact TR4 is associated with the second contact TR2, i.e., the fourth contact TR4 is contactless connected to the second contact TR2 (e.g., through a resistor, a jumper wire or a switch).

Therefore, when the first gallium nitride element and the driving circuit A are welded to the PCB 300, the third contact TR3 and the first contact TR1 are connected through the resistor, the jumper wire or the switch, such that the ground pin of the first gallium nitride element is connected to the ground terminal of the driving circuit A, and when the second gallium nitride element and the driving circuit B are welded to the PCB 300, the fourth contact TR4 and the second contact TR2 are connected through the resistor, the jumper wire or the switch, such that the ground pin of the second gallium nitride element is connected to the ground terminal of the driving circuit B.

According to the embodiment that can be combined with any other embodiments described in the invention, similarly with the first and second contacts TR1 and TR2, the third and fourth contacts TR3 and TR4 also can be pads or via holes.

Figure 5:
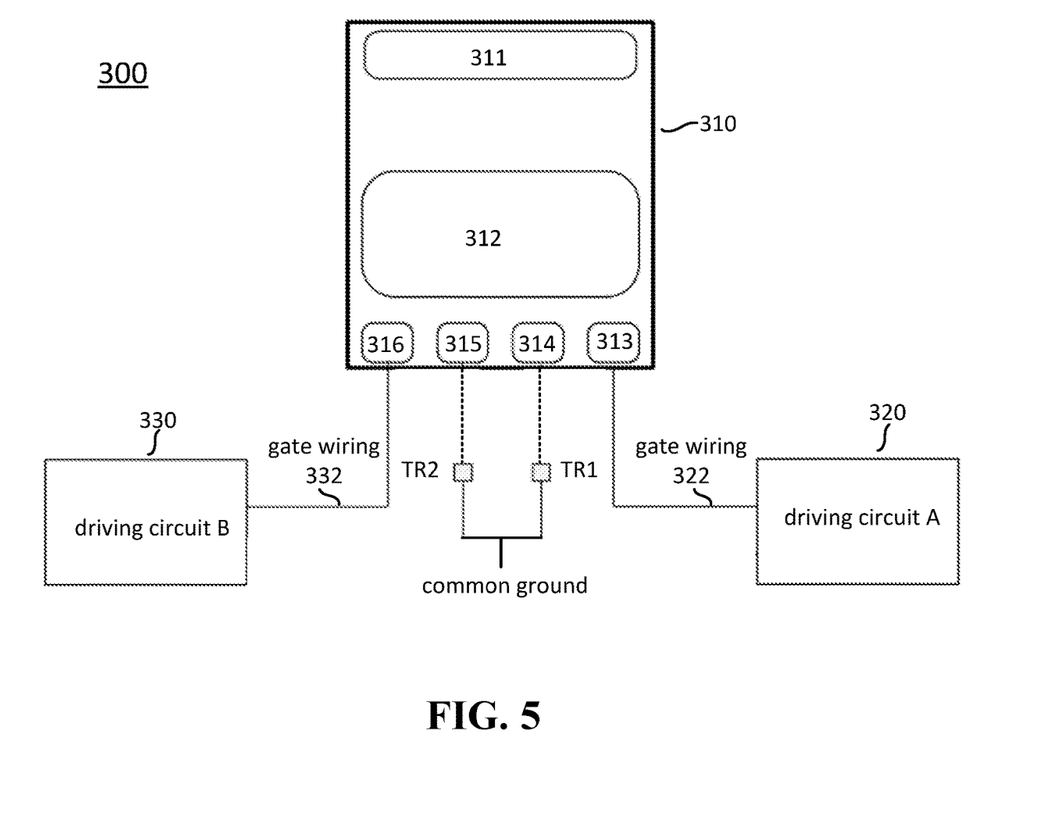
FIG. 5 is a schematic diagram of a PCB for a gallium nitride element according to another embodiment of the invention.

FIG. 5 is a schematic diagram of a PCB for a gallium nitride element according to another embodiment of the invention. The PCB shown in FIG. 5 is similar with that in FIG. 3, and difference in that the first contact TR1 and the second contact TR2 of the PCB 300 in FIG. 5 are connected to a common ground, rather than the ground terminal of the driving circuit A or the driving circuit B.

Actually, in FIG. 3, even if the first contact TR1 and the second contact TR2 are respectively connected to the ground terminal of the driving circuit A or the driving circuit B, they are also finally connected to a common ground. Therefore, even if the welding position 330 is not welded with any component when the first gallium nitride element is welded, or the welding position 320 is not welded with any component when the second gallium nitride element is welded, it also shall be ensured that a peripheral circuit connected to the pads 315-316 does not have influence on operation of the first gallium nitride element, and a peripheral circuit connected to the pads 312-314 does not have influence on operation of the second gallium nitride element through a contactless connection relation between the first contact TR1 and the pad 314, or a contactless connection relation between the second contact TR2 and the pad 315.

Figure 6:
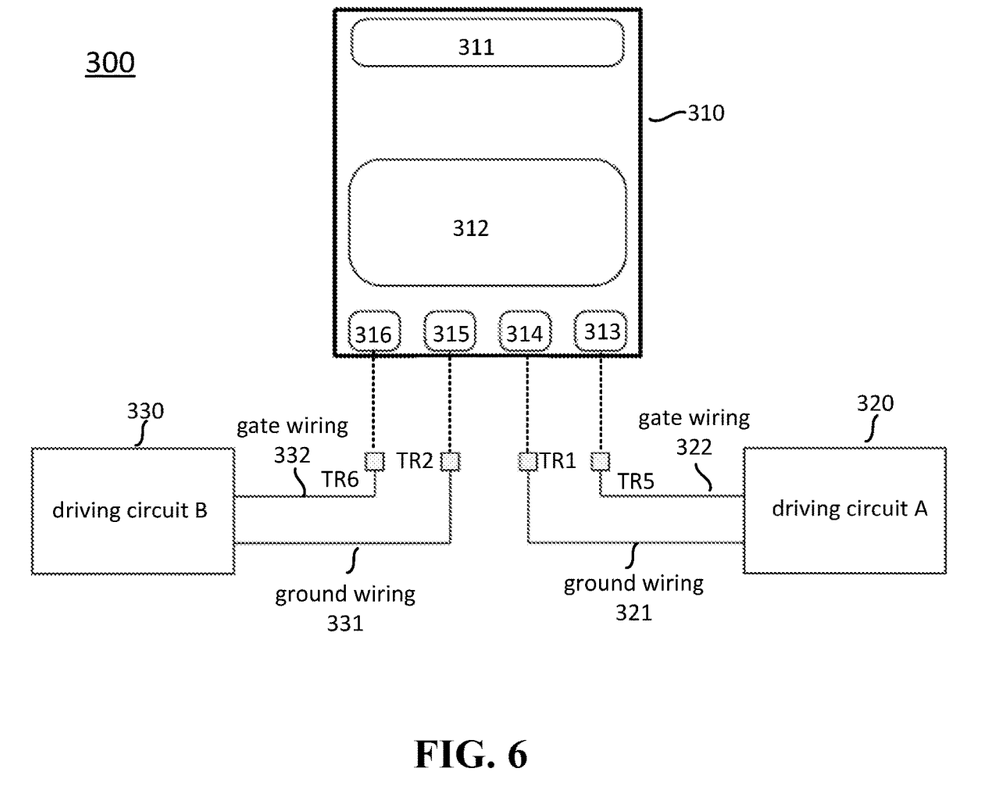
FIG. 6 is a schematic diagram of a PCB for a gallium nitride element according to another embodiment of the invention.

FIG. 6 is a schematic diagram of a PCB for a gallium nitride element according to another embodiment of the invention. The PCB shown in FIG. 6 is similar with that in FIG. 3, and difference in that the PCB 300 further has a fifth contact TR5 and a sixth contact TR6. The fifth contact TR5 is connected to the gate signal terminal of the driving circuit A via the gate wiring 322, and contactless connected to the pad 313 (e.g., through a resistor, a jumper wire or a switch). The sixth contact TR6 is connected to the gate signal terminal of the driving circuit B via the gate wiring 332, and contactless connected to the pad 316 (e.g., through a resistor, a jumper wire or a switch). Therefore, when the first gallium nitride element is welded to the PCB 300, the pad 315 and the second contact TR2, and the pad 316 and the sixth contact TR6 can keep disconnected, so as to ensure that the peripheral circuit connected to the pads 315-316 does not have influence on operation of the first gallium nitride element, and when the second gallium nitride element is welded to the PCB 300, the pad 314 and the first contact TR1, and the pad 313 and the fifth contact TR5 can keep disconnected, so as to ensure that the peripheral circuit connected to the pads 313-314 does not have influence on operation of the second gallium nitride element.

According to the embodiment that can be combined with any other embodiments described in the invention, similarly with the first and second contacts TR1 and TR2, the fifth and sixth contacts TR5 and TR6 also can be pads or via holes. Moreover, according to the embodiment that can be combined with any other embodiments described in the invention, an additional contact connected to the pad 313 and contactless connected to the fifth contact TR5, and an additional contact connected to the pad 316 and contactless connected to the sixth contact TR6 may be further formed on the PCB 300 shown in FIG. 6.

Figure 7:
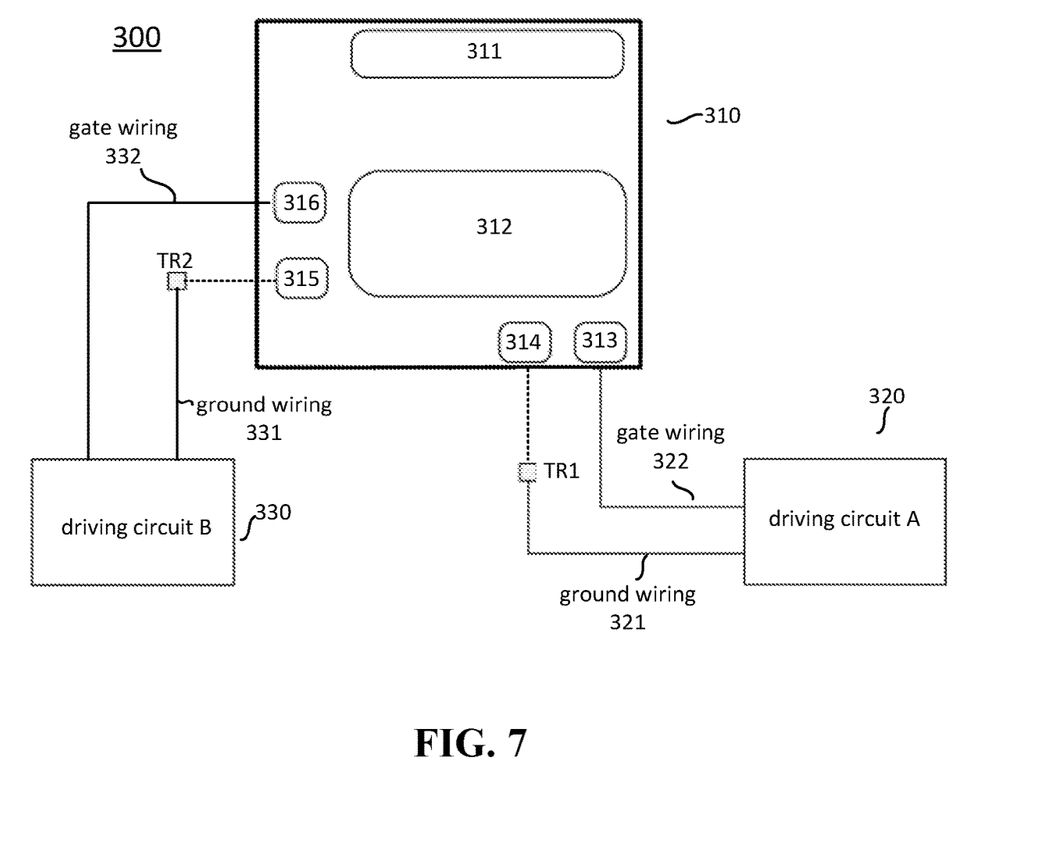
FIG. 7 is a schematic diagram of a PCB for a gallium nitride element according to another embodiment of the invention.

FIG. 7 is a schematic diagram of a PCB for a gallium nitride element according to another embodiment of the invention. The PCB shown in FIG. 7 is similar with that in FIG. 3, and difference in that the pads 313-314 and the pads 315-316 of the PCB 300 are located on different sides of the welding position 310, and the first contact TR1 associated with the pad 314 and the second contact TR2 associated with the pad 315 are also disposed on different sides of the welding position 310. Therefore, only if the positions of the source and drain pins of the gallium nitride elements having different package forms are substantially the same, the PCB 300 can be compatible with the gallium nitride elements having positions of various gate pins and ground pins by disposing the pads for welding the gate pins and the ground pins of the gallium nitride elements on different sides of the welding position 310.

Although the disclosures are directed to the embodiments, other and further embodiments can be designed without departing from substantial scope of the invention, and the scope is determined by the appended claims.

What is claimed is:

1. A printed circuit board (PCB) for a gallium nitride device, on which has been formed with:
    a gallium nitride welding position to which a first gallium nitride element and a second gallium nitride element having different packages are interchangeably welded;
    a first driving circuit welding position to which a first driving circuit of the first gallium nitride element is welded; and
    a second driving circuit welding position to which a second driving circuit of the second gallium nitride element is welded;
    wherein the gallium nitride welding position includes:
        a first gate pad welded to a gate electrode of the first gallium nitride element, and connected to a gate signal terminal of the first driving circuit;
        a second gate pad welded to a gate electrode of the second gallium nitride element, and connected to a gate signal terminal of the second driving circuit;
        a first ground pad;
        a second ground pad;
        a first contact contactless connected to the first ground pad, and directly connected to a ground terminal of the first driving circuit; and
        a second contact contactless connected to the second ground pad, and directly connected to a ground terminal of the second driving circuit.

2. The printed circuit board according to claim 1, wherein the gallium nitride welding position further includes:
    a drain pad to which a drain electrode of the first gallium nitride element or the second gallium nitride element is welded; and
    a source pad to which a source electrode of the first gallium nitride element or the second gallium nitride element is welded.

3. The printed circuit board according to claim 1, wherein the first contact and the first ground pad are connected through a resistor, a jumper wire or a switch, and the second contact and the second ground pad are connected through a resistor, a jumper wire or a switch.

4. The printed circuit board according to claim 1, wherein the first contact and the second contact are pads or via holes.

5. The printed circuit board according to claim 1, wherein the gate signal terminal of the first driving circuit is directly connected to the first gate pad, and the gate signal terminal of the second driving circuit is directly connected to the second gate pad.

6. The printed circuit board according to claim 1, wherein the gallium nitride welding position further includes:
    a third contact directly connected to the first ground pad, and contactless connected to the first contact; and
    a fourth contact directly connected to the second ground pad, and contactless connected to the second contact.

7. The printed circuit board according to claim 6, wherein the first contact and the third contact are connected through a resistor, a jumper wire or a switch, and the second contact and the fourth contact are connected through a resistor, a jumper wire or a switch.

8. The printed circuit board according to claim 1, wherein the gallium nitride welding position further includes:
    a fifth contact contactless connected to the first gate pad, and directly connected to the gate signal terminal of the first driving circuit; and
    a sixth contact contactless connected to the second gate pad, and directly connected to the gate signal terminal of the second driving circuit.

9. The printed circuit board according to claim 8, wherein the fifth contact and the first gate pad are connected through a resistor, a jumper wire or a switch, and the sixth contact and the second gate pad are connected through a resistor, a jumper wire or a switch.

10. The printed circuit board according to claim 8, wherein the gallium nitride welding position further includes:
    a fifth contact contactless connected to the first gate pad, and directly connected to the gate signal terminal of the first driving circuit; and
    a sixth contact contactless connected to the second gate pad, and directly connected to the gate signal terminal of the second driving circuit.

11. The printed circuit board according to claim 10, wherein the fifth contact and the first gate pad are connected through a resistor, a jumper wire or a switch, and the sixth contact and the second gate pad are connected through a resistor, a jumper wire or a switch.

12. The printed circuit board according to claim 1, wherein the first gate pad and the first contact are located on a first side of the gallium nitride welding position, the second gate pad and the second contact are located on a second side of the gallium nitride welding position, and the first side and the second side are the same side or different sides of the gallium nitride welding position.

* * * * *